(12) United States Patent
Sutardja et al.

(10) Patent No.: US 9,147,837 B1
(45) Date of Patent: *Sep. 29, 2015

(54) RESISTIVE MEMORY CELL AND METHOD FOR FORMING A RESISTIVE MEMORY CELL

(71) Applicant: Marvell International Ltd., Hamilton (BM)

(72) Inventors: Pantas Sutardja, Los Gatos, CA (US); Albert Wu, Palo Alto, CA (US); Winston Lee, Palo Alto, CA (US); Peter Lee, Pleasanton, CA (US); Runzi Chang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/609,853

(22) Filed: Jan. 30, 2015

Related U.S. Application Data

(63) Continuation of application No. 14/044,362, filed on Oct. 2, 2013, now Pat. No. 8,947,909.

(60) Provisional application No. 61/720,749, filed on Oct. 31, 2012, provisional application No. 61/710,316, filed on Oct. 5, 2012.

(51) Int. Cl.
*G11C 11/00* (2006.01)
*H01L 45/00* (2006.01)
*G11C 13/00* (2006.01)

(52) U.S. Cl.
CPC ........ *H01L 45/1233* (2013.01); *G11C 13/0002* (2013.01); *G11C 13/004* (2013.01); *G11C 13/0069* (2013.01); *H01L 45/08* (2013.01); *H01L 45/1608* (2013.01)

(58) Field of Classification Search
CPC ...... H01L 45/16; H01L 45/146; G11C 11/16; G11C 13/0002; G11C 13/004; G11C 2213/55
USPC ...................... 365/148, 51, 63, 158
See application file for complete search history.

(56) References Cited

U.S. PATENT DOCUMENTS

| | | | | |
|---|---|---|---|---|
| 7,457,147 | B2* | 11/2008 | Rinerson et al. | 365/148 |
| 7,639,521 | B2* | 12/2009 | Baek et al. | 365/148 |
| 8,179,739 | B2 | 5/2012 | Hanzawa et al. | |
| 8,450,145 | B2 | 5/2013 | Inoue | |
| 8,625,322 | B2 | 1/2014 | Samachisa et al. | |
| 8,625,329 | B2* | 1/2014 | Maejima | 365/148 |
| 8,947,909 | B1* | 2/2015 | Sutardja et al. | 365/148 |

* cited by examiner

*Primary Examiner* — David Lam

(57) ABSTRACT

A resistive element of a resistive memory cell. The resistive element includes a contact in communication with a substrate. A bottom electrode is formed on the contact. A transitional metal oxide layer is formed on the bottom electrode. The transitional metal oxide layer includes oxygen vacancies configured to receive donor oxygen atoms. A transition layer formed on the transitional metal oxide layer includes donor oxygen atoms. A reactive metal layer is formed on the transition layer. A top electrode is formed on the transitional metal oxide layer. The transition layer is configured to provide the donor oxygen atoms to the transitional metal oxide layer in response to a voltage being applied to the top electrode.

18 Claims, 10 Drawing Sheets

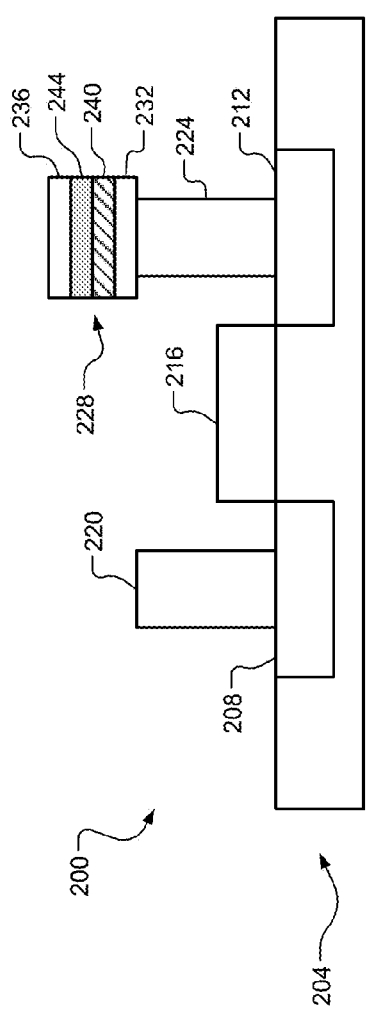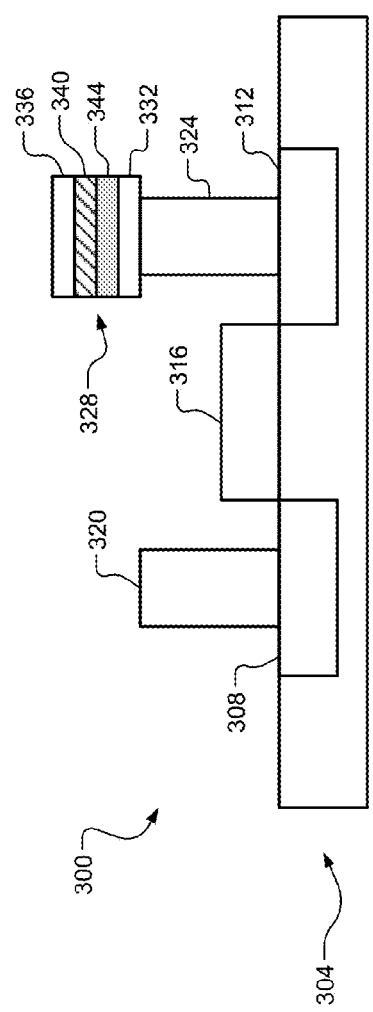

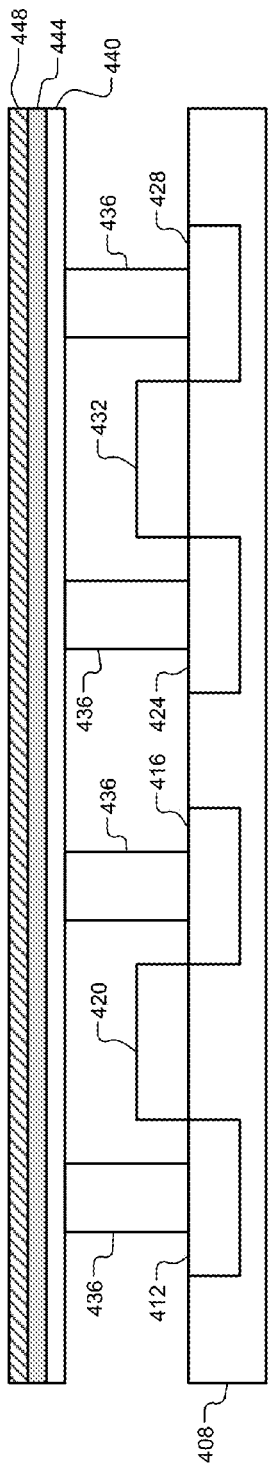
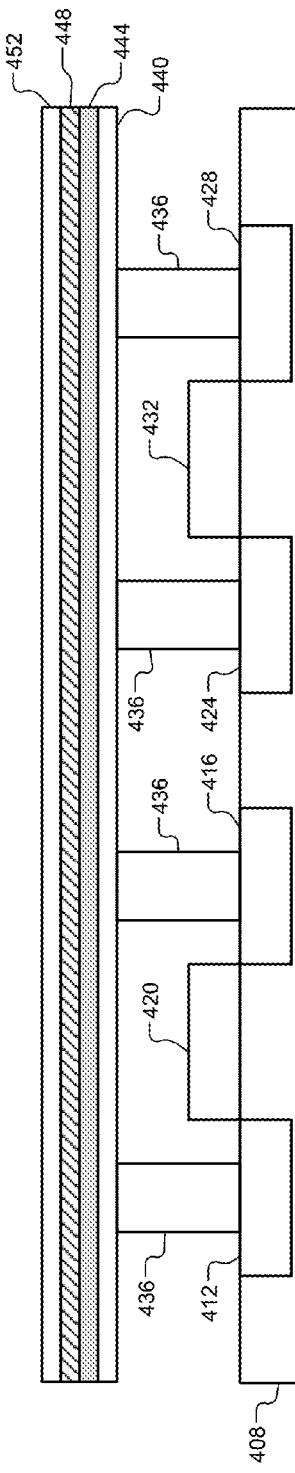
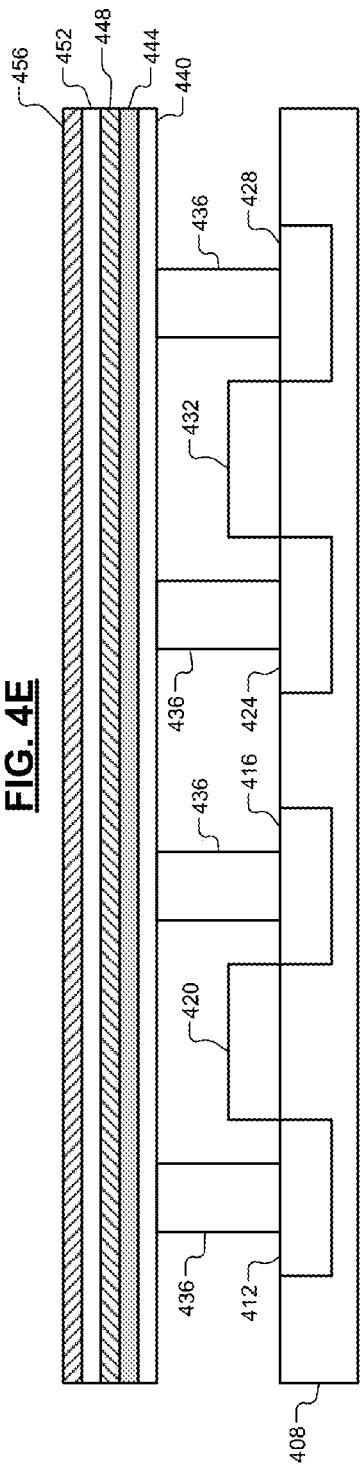
FIG. 4D
FIG. 4E
FIG. 4F

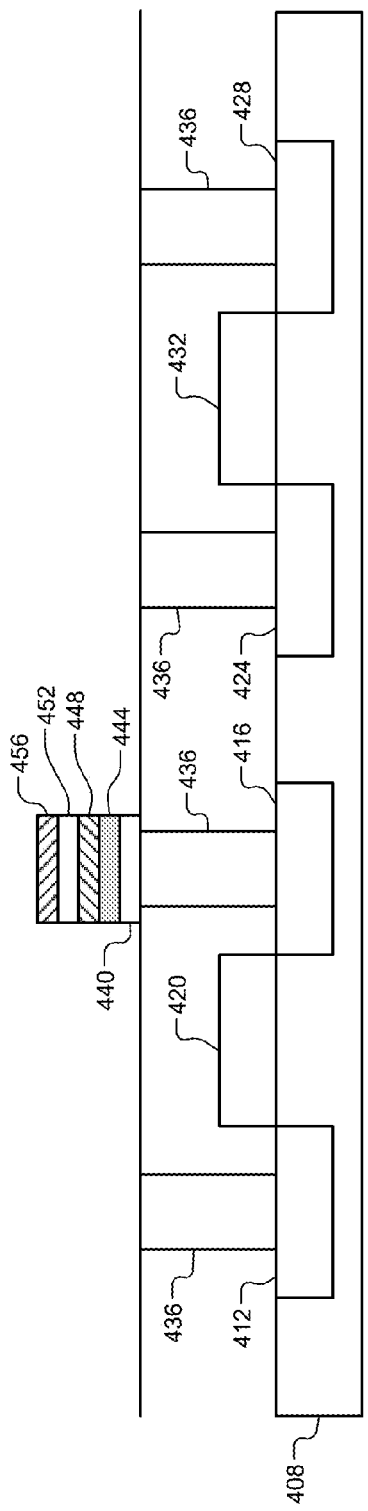
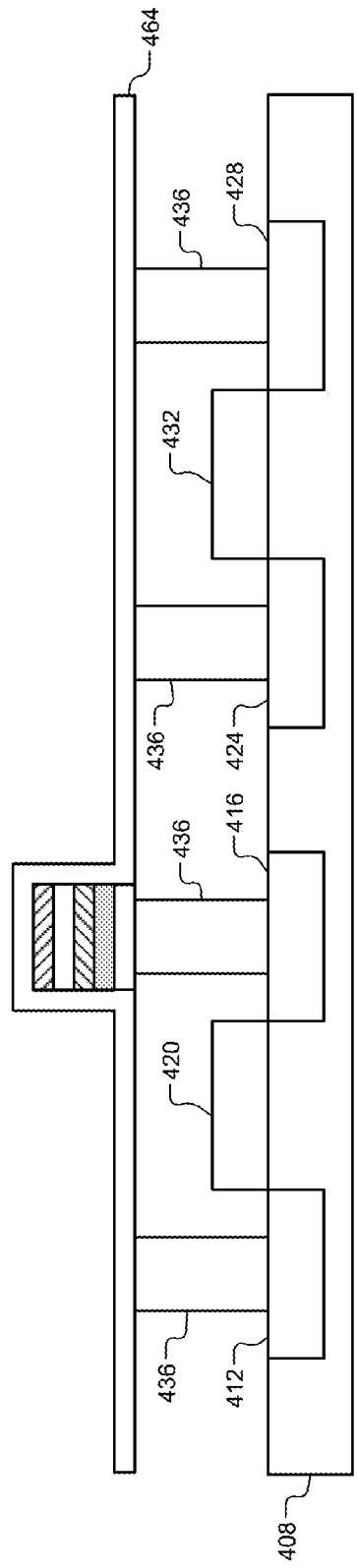

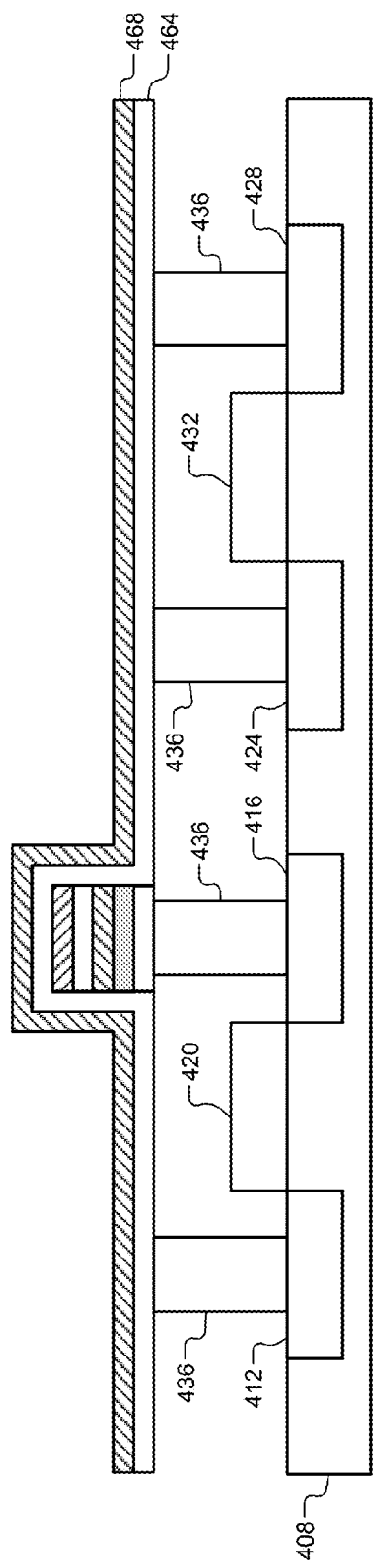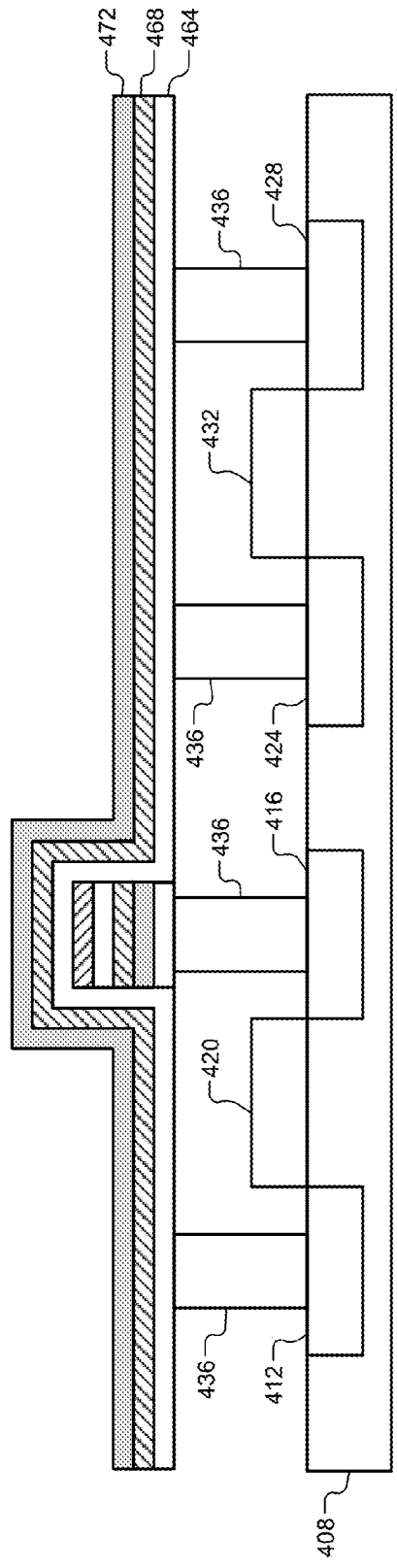

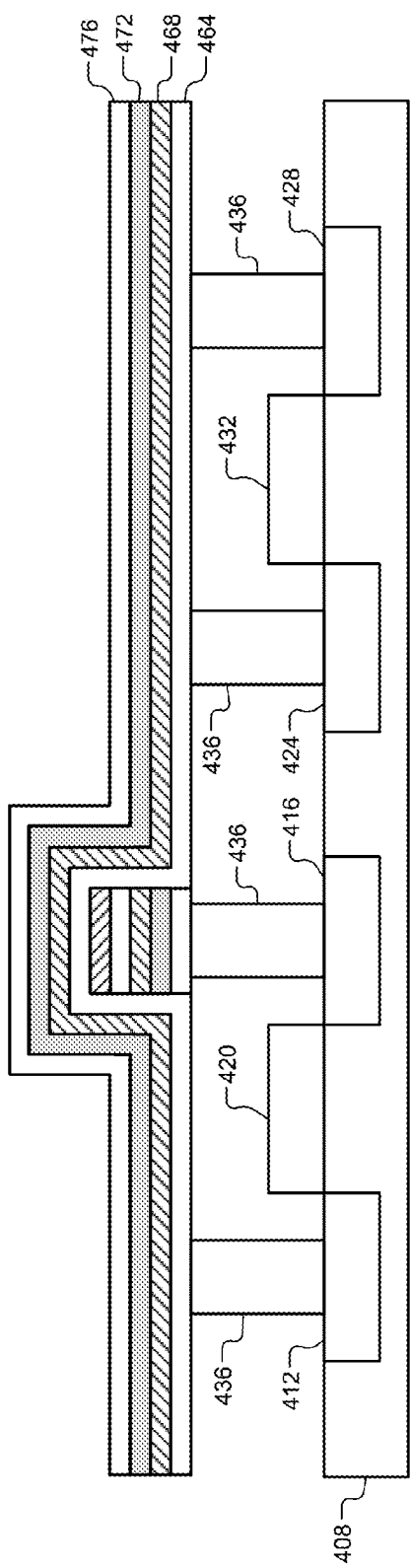
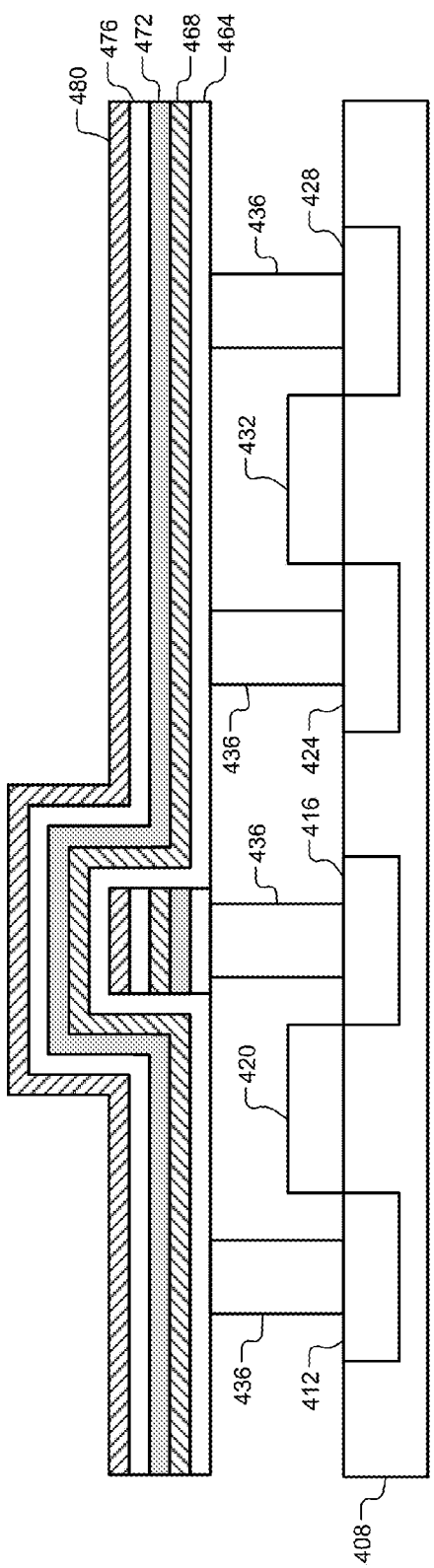

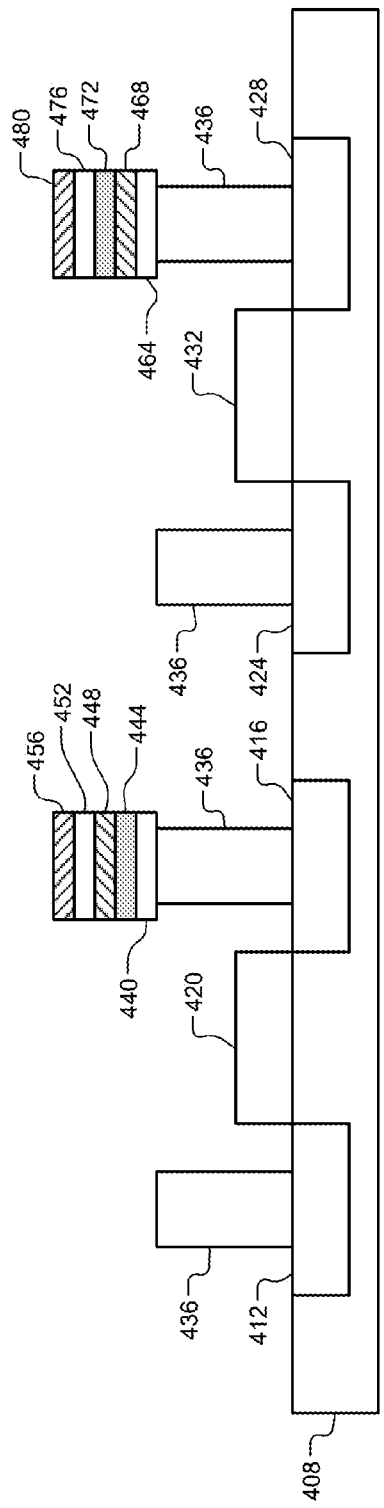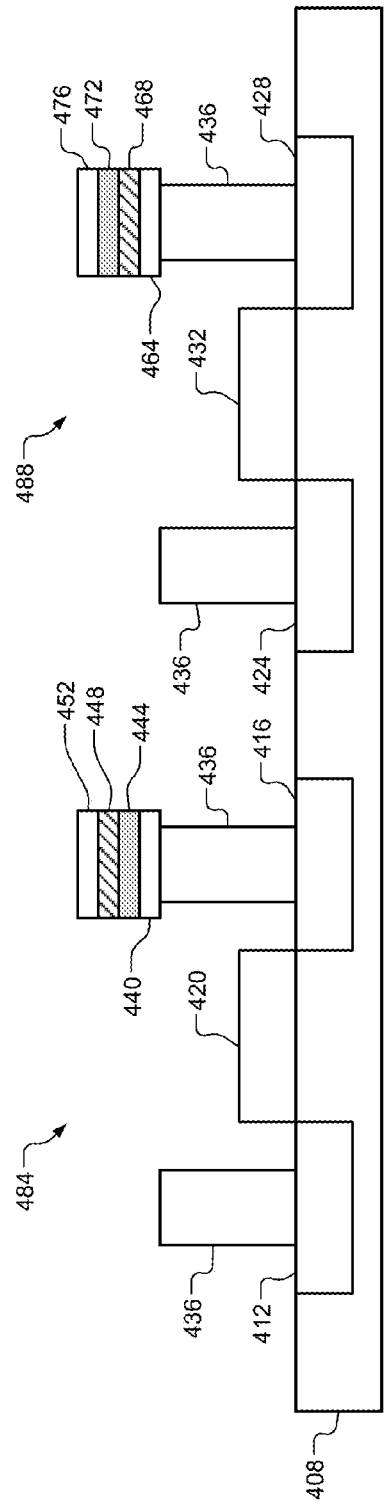

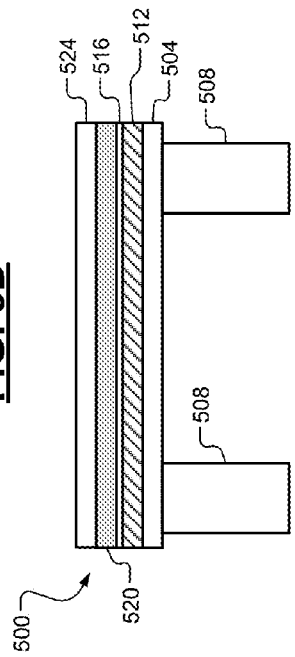
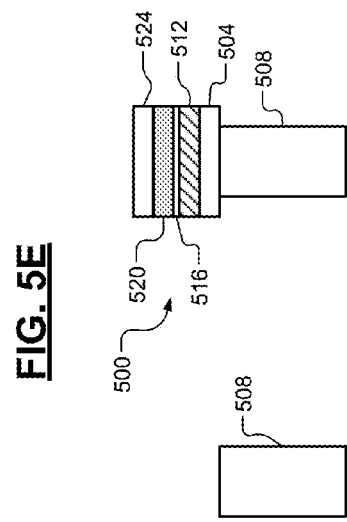
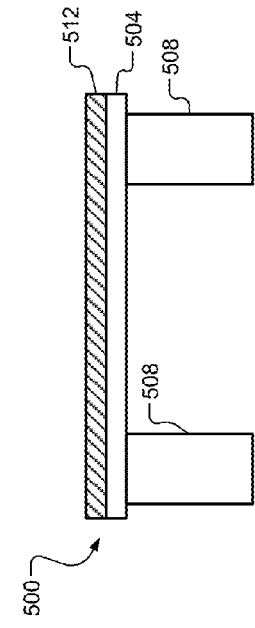
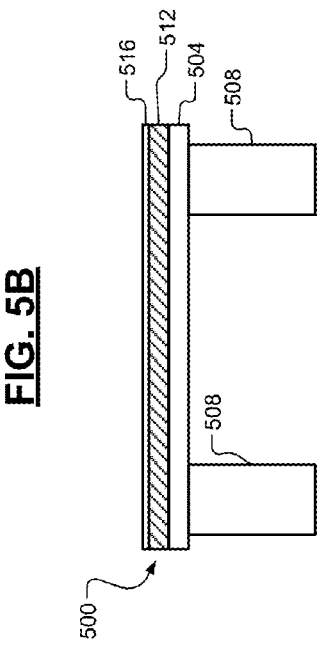
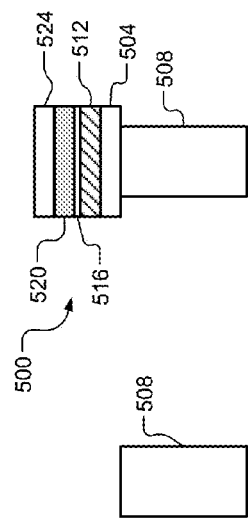

RESISTIVE MEMORY CELL AND METHOD FOR FORMING A RESISTIVE MEMORY CELL

CROSS-REFERENCE TO RELATED APPLICATIONS

The present disclosure is a continuation of U.S. patent application Ser. No. 14/044,362 (now U.S. Pat. No. 8,947,909), filed on Oct. 2, 2013, which claims the benefit of U.S. Provisional Application No. 61/710,316, filed on Oct. 5, 2012, and U.S. Provisional Application No. 61/720,749, filed on Oct. 31, 2012. The entire disclosures of the applications referenced above are incorporated herein by reference.

FIELD

The present disclosure relates to systems and methods for creating resistive memory, including creating bipolar resistive memory and forming resistive memory cells during manufacturing.

BACKGROUND

A nonvolatile memory can include an array of memory cells. Each of the memory cells can have multiple resistive states. Certain nonvolatile memories (referred to herein as "resistive memories"), such as phase change random access memory (PCRAM), resistive random access memory (RRAM), and magnetic random access memory (MRAM), include memory cells with respective resistances. Each of the resistances changes based on the state of the corresponding memory cell. For example, a memory cell can have a first (or low) resistive state when storing a '0' and a second (or high) resistive state when storing a '1'.

As a first example, in order to determine a resistive state of a memory cell, a voltage can be applied across the resistance of the memory cell. A current through the resistance can then be detected and is indicative of the resistive state. Based on the detected current, the resistive state of the memory cell is determined. As another example, a current can be supplied to the resistance of the memory cell. A voltage across the resistance can then be detected and is indicative of the resistive state. The resistive state of the memory cell can then be determined based on the detected voltage.

SUMMARY

A resistive memory having a plurality of resistive elements. A resistance of each resistive memory element changes with respect to a state of the resistive memory element. The resistive memory includes a substrate, a first memory access device formed on the substrate, a first contact formed on the first memory access device, and a first resistive memory element formed on the first contact. The first resistive memory element has a first polarity. The first memory access device provides read access and write access to the state of the first resistive memory element. The resistive memory further includes a second memory access device formed on the substrate, a second contact formed on the second memory access device, and a second resistive memory element formed on the second contact. The second resistive memory element has a second polarity that is opposite to the first polarity of the first resistive memory element. The second memory access device provides read access and write access to the state of the second resistive memory element.

A method of forming a resistive memory having a plurality of resistive elements, wherein a resistance of each resistive memory element changes with respect to a state of the resistive memory element, includes forming a first memory access device and a second access device on the substrate, forming a first contact on the first memory access device and forming a second contact on the second memory access device, and forming a first resistive memory element on the first contact. The first resistive memory element has a first polarity, and the first memory access device provides read access and write access to the state of the first resistive memory element. The method further includes forming a second resistive memory element on the second contact. The second resistive memory element has a second polarity that is opposite to the first polarity of the first resistive memory element, and the second memory access device provides read access and write access to the state of the second resistive memory element.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 2 is an RRAM cell having a first polarity.

FIG. 3 is an RRAM cell having a second polarity.

FIGS. 5A-5F illustrate example manufacturing steps for creating a resistive memory cell having a resistive element formed during the manufacturing.

In the drawings, reference numbers may be reused to identify similar and/or identical elements.

DESCRIPTION

Figure 1C:
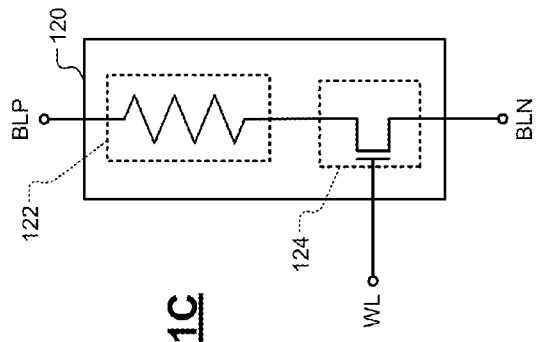
FIG. 1C is a schematic of an RRAM cell.
Figure 1A:
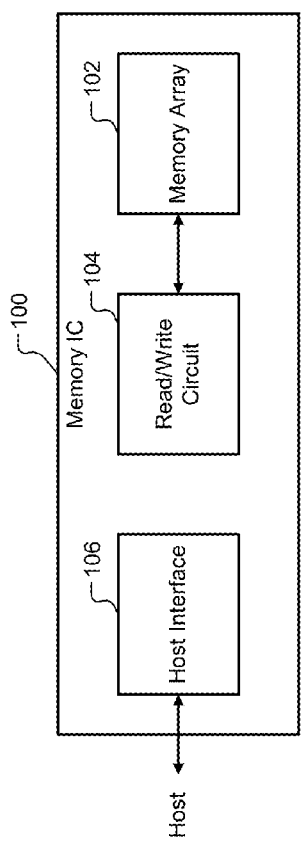
FIG. 1A is a functional block diagram of a memory integrated circuit (IC) comprising resistive random access memory (RRAM) cells.

FIG. 1A shows a memory integrated circuit (IC) 100. The memory IC 100 includes a memory array 104, a read/write circuit 108, and a host interface 112. The memory array 104 includes a plurality of resistive random access memory (RRAM) cells (hereinafter resistive memory cells). The memory array 104 includes a plurality of word lines and a plurality of bit lines. The bit lines may be perpendicular to the word lines. The resistive memory cells are arranged at intersections of the word lines and bit lines. The read/write circuit 108 reads data from and writes data to the resistive memory cells. The host interface 112 interfaces the memory IC 100 to a host.

The host interface 112 receives read/write commands from the host and outputs the read/write commands to the read/write circuit 108. In response to a read command, the read/write circuit 108 reads data from the resistive memory cells in the memory array 104 and outputs the read data to the host interface 112. The host interface 112 forwards the read data to the host. In response to a write command, the read/write circuit 108 writes data to the resistive memory cells in the memory array 104.

Figure 1B:
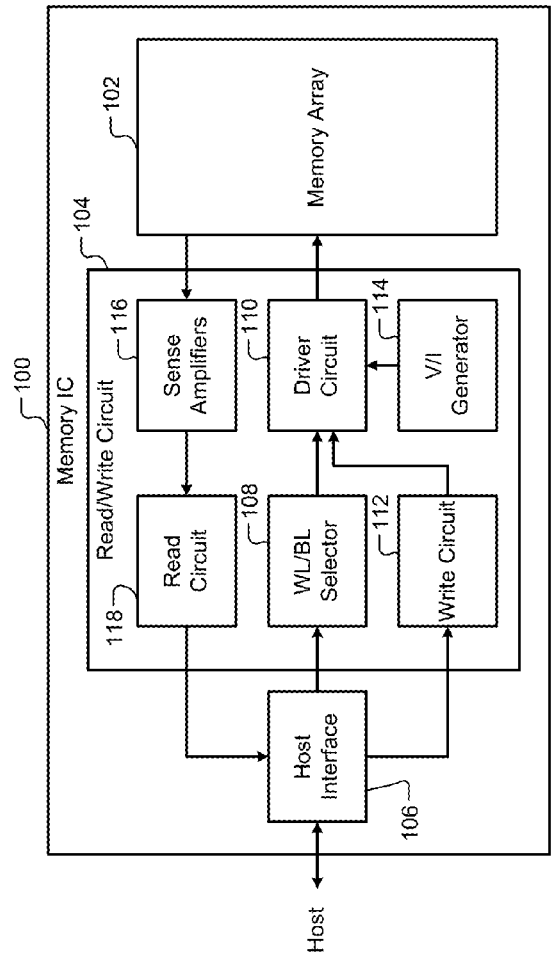
FIG. 1B is a detailed functional block diagram of the memory IC of FIG. 1A.

FIG. 1B shows the read/write circuit 108 of the memory IC 100 in further detail. The read/write circuit 108 includes a word line (WL)/bit line (BL) selector 116, a driver circuit 120, a write circuit 124, a voltage/current (V/I) generator 128, a plurality of sense amplifiers 132, and a read circuit 136. When the host interface 112 receives a write command, the host interface 112 outputs the address or addresses of memory cells in the memory array 104 where data needs to be written and outputs the data to be written in the memory cells to the write circuit 124. Based on the address or addresses of the memory cells, the WL/BL selector 116 selects appropriate word lines to select the memory cells for writing data. The driver circuit 120 receives the data from the write circuit 124. Based on the data, the driver circuit 120 selects one or more voltages (and/or currents) generated by the V/I generator 128 and applies the one or more voltages (and/or currents) to the selected word lines and bit lines and writes the data to the selected memory cells.

When the host interface 112 receives read command, the host interface 112 outputs the address or addresses of memory cells in the memory array 104 from which data needs to read. Based on the address or addresses of the memory cells, the WL/BL selector 116 selects appropriate word lines to select the memory cells from which data is to be read. The driver circuit 120 selects one or more voltages (and/or currents) generated by the V/I generator 128 and applies the one or more voltages (and/or currents) to the selected word lines and bit lines. The sense amplifiers 132 sense voltages on the bits lines (or currents through the bits lines) and sense the states of (i.e., read data stored in) the selected memory cells. The read circuit 136 reads the data sensed by the sense amplifiers 132 and outputs the read data to the host interface 112.

FIG. 1C shows an example of a resistive memory cell 140 of the memory array 104. The resistive memory cell 140 shown is a bipolar resistive memory cell. The resistive memory cell 140 includes a resistive element 144 and a switching element 148. The resistive element 144 and the switching element 148 are connected in series. The switching element 148 may be referred to as a "memory access device" and is configured to provide read and write access to the resistive element 144. For example only, the switching element 148 includes a metal-oxide semiconductor field-effect transistor (MOSFET). A gate of the switching element 148 is connected to a word line. A first terminal of the resistive element 144 is connected to a positive bit line (BLP). A second terminal of the resistive element 144 is connected to a first terminal of the switching element 148 (e.g., a drain of the MOSFET). The second terminal of the switching element 148 (e.g., a source of the MOSFET) is connected to a negative bit line (BLN).

The resistive memory cell 140 is selected using the word line. The resistive memory cells 140 can be programmed to a first state (e.g., a high resistance state) or a second state (e.g., a low resistance state). For example, the resistive memory cell 140 can be programmed to the first state by passing current in a first direction through the resistive element 144 (e.g., from BLP to BLN), or to the second state by passing current in a second direction to the resistive element 144 (e.g., from BLN to BLP).

To read a state of (i.e., data stored in) the resistive memory cell 140, the word line connected to the resistive memory cell 140 is selected. Then a current is forced through the resistive memory cell 140 through the bit line connected to the resistive memory cell 140, and a voltage on the bit lines is sensed. The voltage is high if the resistive memory cell 140 is programmed to the high resistance state and low if the resistive memory cell 140 is programmed to the low resistance state. Alternatively, a voltage is applied to the bit line connected to the resistive memory cell 140, and current through the bit lines is sensed. The current is low if the resistive memory cell 140 is programmed to the high resistance state and high if the resistive memory cell 140 is programmed to the low resistance state.

FIG. 2 shows an example resistive memory cell 200. The memory cell 200 includes a substrate 204. A source region 208 and a drain region 212 are formed in the substrate 204, and a gate 216 is formed on the substrate 204. The source region 208, the drain region 212, and the gate 216 correspond to a memory access device. Although shown in an NMOS transistor configuration, a PMOS configuration may also be used. For example, in a PMOS configuration, positions of the source region 208 and the drain region 212 may be reversed. A first contact 220 and a second contact 224 corresponding to the source region 208 and a drain region 212, respectively, are provided on the substrate 204. For example, the first contact 220 and the second contact 224 include titanium nitride (TiN).

A resistive element 228 having a first polarity is formed on the second contact 224 between a bottom electrode (BE) 232 and a top electrode (TE) 236. The resistive element 228 includes a transitional metal oxide (TMO) layer 240 formed on the bottom electrode 232 and a reactive metal layer 244 formed on the TMO layer 240. The top electrode 236 is formed on the reactive metal layer 244. The reactive metal layer 244 may be referred to as an "Oxygen Getter Layer" (OGL). For example, the TMO layer 240 includes $HfO_2$ (Hafnium oxide) and the reactive metal layer 244 includes titanium (Ti).

The memory cell 200 is configured to maintain a first state or a second state based on a voltage applied across the resistive element 228 during a write operation. As shown, a positive voltage (V+) is applied to the top electrode 236 and a negative voltage (V−) is applied to the bottom electrode 232 to apply a voltage across the resistive element 228 in a first direction. Consequently, an electrical field is created across the TMO layer 240, causing oxygen atoms in the TMO layer 240 move upward toward the reactive metal layer 244. In this first state, the TMO layer 240 becomes a conductive filament and the resistive element 228 is SET. The conductive filament may correspond to a single portion of the TMO layer 240, multiple separate portions of the TMO layer 240 (i.e., multiple filaments), or the entire TMO layer 240.

Conversely, a negative voltage (V−) is applied to the top electrode 236 and a positive voltage (V+) is applied to the bottom electrode 232 to apply a voltage across the resistive element 228 in a second direction). Consequently, the oxygen atoms in the TMO layer 240 move downward away from the reactive metal layer 244. In this second state, the TMO layer 240 becomes nonconductive and the resistive element 228 is RESET.

In each of the first state and the second state, the corresponding state can be read (e.g., using the read/write circuit 108 as shown in FIG. 1B). For example, to read the resistive element 228, a small current or voltage (e.g., a read voltage or read current) can be applied across the resistive element 228 in the first direction. Because a resistance of the resistive element 228 is different in the first (conductive) state and the second (nonconductive) state, measuring the resultant voltage or current indicates which of the first state or the second state the resistive element 228 is in.

Typically, the voltage applied to read the resistive element 228 is applied in the same direction (e.g., the first direction) as the voltage to SET the resistive element 228. In other words, to read the state of resistive element 228, a positive voltage (V+) is applied to the top electrode 236 and a negative voltage (V−) is applied to the bottom electrode 232. The voltage is applied in the first direction to read the resistive element 228 because applying the voltage in the second direction may RESET the resistive element 228. More specifically, applying the voltage in the second direction may cause the oxygen atoms in the TMO layer 240 to move downward away from the reactive metal layer 244 and change the state of the resistive element 228.

FIG. 3 shows an example resistive memory cell 300. The memory cell 300 includes a substrate 304. A drain region 308 and a source region 312 are formed in the substrate 304, and a gate 316 is formed on the substrate 304. A first contact 320 and a second contact 324 corresponding to the source region 308 and a drain region 312, respectively, are provided on the substrate 304. For example, the first contact 320 and the second contact 324 include titanium nitride (TiN).

A resistive element 328 having a second polarity is formed on the second contact 324 between a bottom electrode (BE) 332 and a top electrode (TE) 336. The resistive element 328 includes a transitional metal oxide (TMO) layer 340 and a reactive metal layer 344. The reactive metal layer 344 is formed on the bottom electrode 332 and the TMO layer 340 is formed on the reactive metal layer 344. The top electrode 336 is formed on the TMO layer 340. In other words, positions of the TMO layer 340 and the reactive metal layer 344 in the memory cell 300 are reversed with respect to positions of the TMO layer 240 and the reactive metal layer 244 in the memory cell 200 of FIG. 2. As such, the resistive element 328 has a second polarity and the resistive element 228 has a first polarity that is opposite the second polarity.

Accordingly, voltages are applied across the resistive element 328 differently (e.g., in opposite directions) than the resistive element 228 to SET, RESET, and read the states of the resistive element 328. For example, a negative voltage (V−) is applied to the top electrode 336 and a negative voltage (V+) is applied to the bottom electrode 332 to apply a voltage across the resistive element 328 in the second direction. Consequently, an electrical field is created across the TMO layer 340, causing oxygen atoms in the TMO layer 340 move downward toward the reactive metal layer 344. In this first state, the TMO layer 340 becomes a conductive filament and the resistive element 328 is SET.

Conversely, a positive voltage (V+) is applied to the top electrode 336 and a negative voltage (V−) is applied to the bottom electrode 332 to apply a voltage across the resistive element 328 in the first direction). Consequently, the oxygen atoms in the TMO layer 340 move upward away from the reactive metal layer 344. In this second state, the TMO layer 340 becomes nonconductive and the resistive element 328 is RESET.

To read the resistive element 328, a small current or voltage can be applied across the resistive element 328 in the second direction (e.g., in the same direction as the voltage to SET the resistive element 328). In other words, to read the state of resistive element 328, a negative voltage (V−) is applied to the top electrode 336 and a positive voltage (V+) is applied to the bottom electrode 332. The voltage is applied in the second direction to read the resistive element 328 because applying the voltage in the first direction may RESET the resistive element 328 since the polarity with respect to the resistive element 228 is reversed. More specifically, applying the voltage in the first direction may cause the oxygen atoms in the TMO layer 340 to move upward away from the reactive metal layer 344 and change the state of the resistive element 328.

A circuit including a resistive memory (e.g., the memory IC 100 as shown in FIGS. 1A and 1B) may have characteristics and/or efficiency requirements that are more compatible with applying the read voltage or the read current in a particular direction (e.g., the second direction). Or, the circuit may require the flexibility to apply the read voltage or the read current in either the first direction or the second direction. The resistive memory cell 200 including the resistive memory 228 having the first polarity may be provided to meet circuit efficiency requirements corresponding to applying the read voltage or the read current in the first direction. Conversely, the resistive memory cell 300 including the resistive memory 328 having the second polarity may be provided to meet circuit efficiency requirements corresponding to applying the read voltage or the read current in the second direction.

In this manner, the reactive metal layer (244 or 344) of the corresponding resistive element (228 or 328, respectively) is in contact with an anode electrode during a read operation. In other words, for the resistive element 228, the top electrode 236 corresponds to the anode electrode for a read in the first direction. Conversely, for the resistive element 328, the bottom electrode 332 corresponds to the anode electrode for a read in the second direction.

Further, one or more of each of the resistive memory cell 200 and the resistive memory cell 300 can be provided on a same substrate (e.g., a Si wafer of the memory IC 100). Accordingly, a memory array including resistive memory cells 200 and 300 of both polarities may be configured to provide circuit flexibility to a corresponding memory IC.

Figure 4A:
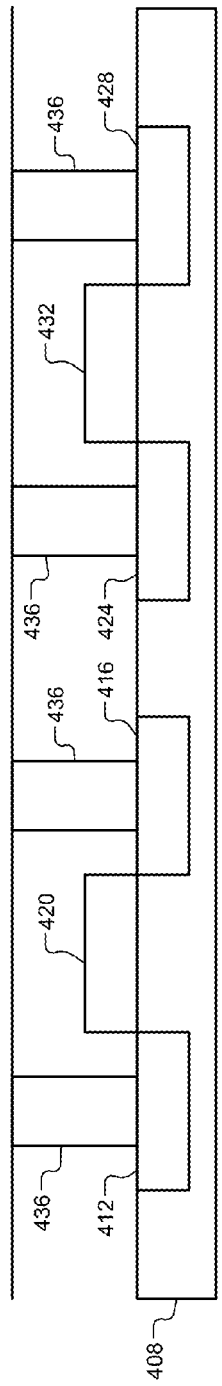
FIGS. 4A-4N, 4P, and 4Q illustrate manufacturing steps for providing resistive memory cells of different polarities on a same substrate.

FIGS. 4A-4N, 4P, and 4Q illustrate example manufacturing steps for providing resistive memory cells of different polarities on a same substrate. FIG. 4A shows a first transistor 400 and a second transistor 404 formed in a same substrate 408. For example, the first transistor 400 and a second transistor 404 are NMOS transistors. The first transistor 400 includes a drain 412, a source 416, and a gate 420 and corresponds to a resistive memory cell having the second polarity. The second transistor 404 includes a source 424, a drain 428, and a gate 432 and corresponds to a resistive memory cell having the first polarity. The first transistor 400 and the second transistor 404 include respective contacts 436. The first transistor 400, the second transistor 404, and the contacts 436 can be formed in and/or on the substrate 408 using any known manufacturing process.

Figure 4B:
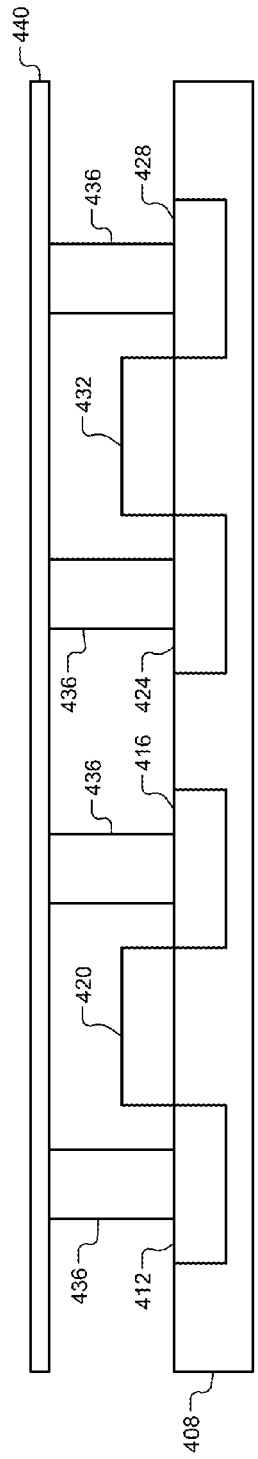
Figure 4C:
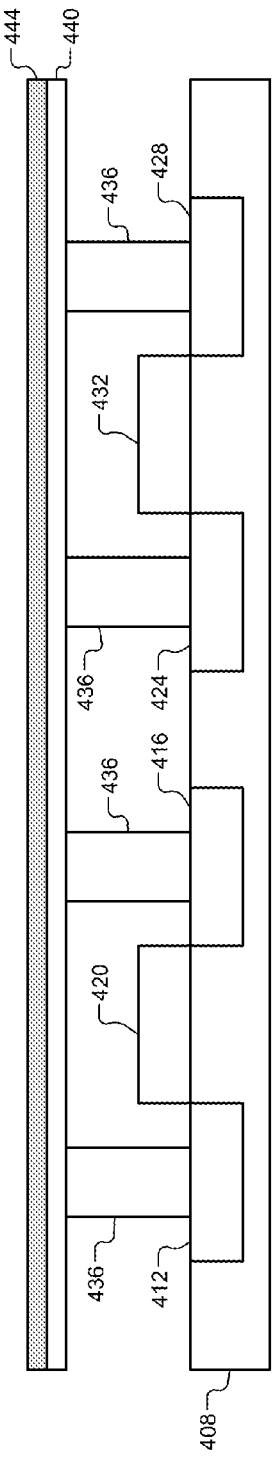
Figure 4G:
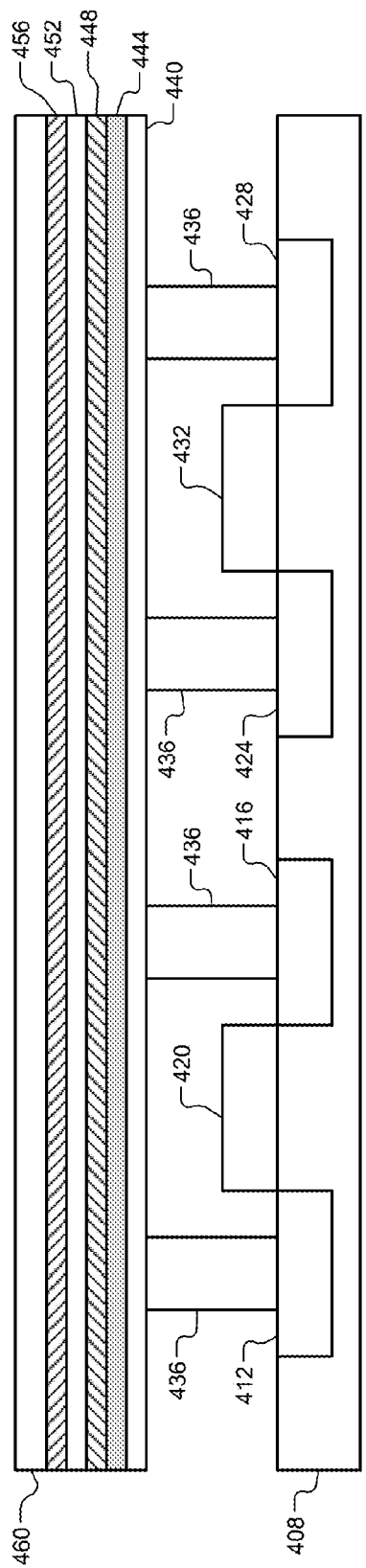
Figure 4H:
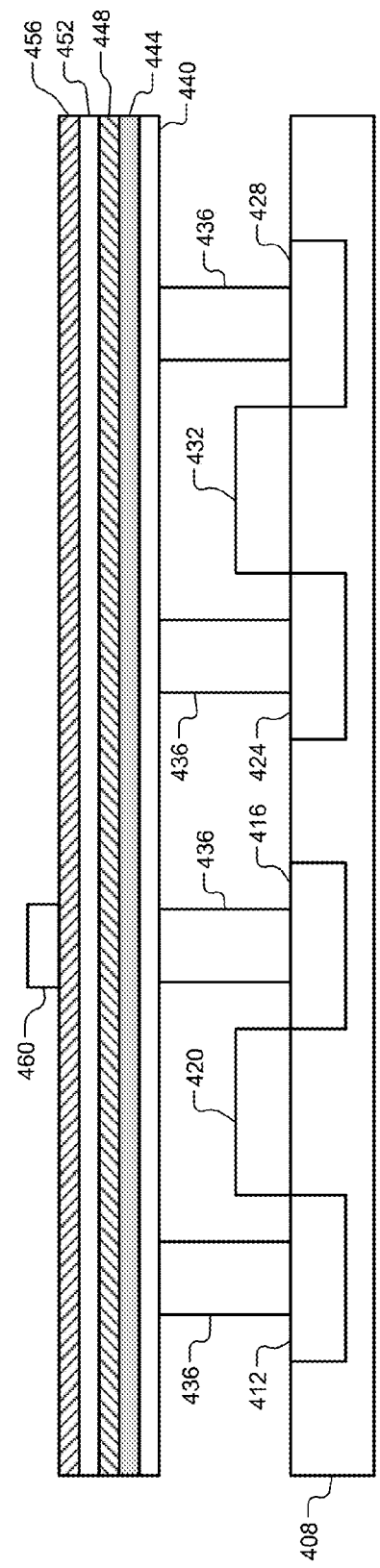

FIG. 4B shows a bottom electrode 440 formed on the contacts 436. FIG. 4C shows a reactive metal layer 444 formed on the bottom electrode 440. FIG. 4D shows a TMO layer 448 formed on the reactive layer 444. FIG. 4E shows a top electrode 452 formed on the TMO layer 448. FIG. 4F shows a hard mask layer (e.g., silicon nitride, or $Si_3N_4$) 456 formed on the top electrode 452. FIG. 4G shows a photoresist layer 460 formed on the hard mask layer 456. FIG. 4H shows the photoresist layer 460 removed, but with a portion of the photoresist layer 460 retained over one of the contacts 436. FIG. 4I shows portions of the bottom electrode 440, the TMO layer 444, the reactive metal layer 448, the top electrode 452, and the hard mask layer 456 removed (e.g., by an anisotropic etching process).

FIG. 4J shows a bottom electrode 464 formed on the contacts 426. FIG. 4K shows a TMO layer 468 formed on the bottom electrode 464. FIG. 4L shows a reactive metal layer 472 formed on the TMO layer 468. FIG. 4M shows a top electrode 476 formed on the reactive metal layer 472. FIG. 4N shows a hard mask layer 480 formed on the top electrode 476. FIG. 4P shows portions of the bottom electrode 464, TMO layer 468, reactive metal layer 472, top electrode 476, and hard mask layer 480 removed (e.g., using a similar process as shown in FIGS. 4G and 4H). The hard mask layers 456 and 480 prevent the etching process from removing desired electrode, TMO, and reactive metal layers formed on respective contacts 436 of the first transistor 400 and the second transistor 404. FIG. 4Q shows the hard mask layers 456 and 480 removed, resulting in a first resistive memory cell 484 having the second polarity and a second resistive memory cell 488 having the first polarity formed on a same substrate 408.

A resistive memory may be only one-time "forming" capable. The term "forming" refers to activation of memory cells in a resistive memory. After manufacturing of the resistive memory, voltages (e.g., forming voltages) can be applied to, for example, bit lines of the resistive memory to activate the memory cells. The forming voltages applied may be relatively high as compared to the voltages applied to SET, RESET, and/or read a resistive memory cell (e.g., the forming voltages may be greater than the voltages applied to the bit lines during read and write operations of the resistive memory). The high forming voltages break down the dielectric properties of the TMO layer to form an initial conductive filament and allow subsequent setting and resetting of the resistive memory element. The forming voltages are applied only a single time and prior to performing any read and write operations.

In other implementations according to the principles of the present disclosure, the forming of the RRAM cells is performed during manufacturing instead of being performed after manufacturing. For example, the resistive element may be manufactured to include a modified TMO layer according to the principles of the present disclosure.

FIGS. 5A-5F illustrate example manufacturing steps for creating a resistive memory cell 500 having a resistive element formed during the manufacturing. FIG. 5A shows a bottom electrode 504 formed on contacts 508. FIG. 5B shows a modified TMO layer 512 formed on the bottom electrode according to the principles of the present disclosure. Rather than being formed of $HfO_2$ (e.g., "balanced") as described in FIGS. 2-4, the modified TMO layer 512 may be formed of $HfO_x$, where x is less than 2. In other words, a ratio of oxygen to Hf (i.e., a stoichiometry) in the modified TMO layer 512 is changed (e.g., from 2:1 to less than 2:1), and the modified TMO layer 512 has a lower oxygen composition than a TMO layer formed of $HfO_2$. Accordingly, the modified TMO layer 512 includes oxygen "vacancies." The oxygen vacancies in the modified TMO layer 512 allow the resistive memory cell 500 to be SET and RESET without first applying the higher forming voltage after manufacturing. More specifically, the modified TMO layer 512 including the oxygen vacancies is already formed and/or SET during manufacturing. In other implementations, the modified TMO layer 512 may be created by, for example, applying an ultraviolet light cure or electron beam cure to form the oxygen vacancies in the modified TMO layer 512.

FIG. 5C shows an optional transition layer 516 is formed on the modified TMO layer 512. For example, the transition layer 516 is an oxygen rich thin interface film and may include $TiO_y$ or another material with surplus oxygen atoms. The transition layer 516 may be formed using a process such as Atomic Layer Deposition (ALD) and may be a mono- or multi-layer. Further, the transition layer 516 may be thinner than the TMO layer 512 and other layers of the resistive memory cell 500. Accordingly, the transition layer 516 is configured to provide donor oxygen atoms to the modified TMO layer 512. In other words, because of the oxygen vacancies in the modified TMO layer 512, the resistive memory cell 500 is SET during manufacturing, and the donor oxygen atoms in transition layer 516 allow the resistive memory cell 500 to be subsequently RESET (i.e., a voltage is applied to cause the donor oxygen atoms to move from the transition layer 516 to the modified TMO layer 512.

FIG. 5D shows a reactive metal layer 520 formed on the transition layer 516. FIG. 5E shows a top electrode 524 formed on the reactive metal layer 520. FIG. 5F shows the completed, patterned resistive memory cell 500. Although shown having the first polarity as described in FIG. 2, the resistive memory cell 500 can be formed to have the second polarity as described in FIG. 3 (i.e., with the reactive metal layer 520 formed on the bottom electrode 504, the transition layer 516 formed on the reactive metal layer 520, and the modified TMO layer 512 formed on the transition layer 516).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A resistive element of a resistive memory cell, the resistive element comprising:
    a contact in communication with a substrate;
    a bottom electrode formed on the contact;
    a transitional metal oxide layer formed on the bottom electrode, wherein the transitional metal oxide layer includes oxygen vacancies configured to receive donor oxygen atoms;
    a transition layer formed on the transitional metal oxide layer, wherein the transition layer includes donor oxygen atoms;
    a reactive metal layer formed on the transition layer; and
    a top electrode formed on the transitional metal oxide layer, wherein the transition layer is configured to provide the donor oxygen atoms to the transitional metal oxide layer in response to a voltage being applied to the top electrode.

2. The resistive element of claim 1, wherein the transitional metal oxide layer comprises hafnium and/or hafnium oxide.

3. The resistive element of claim 1, wherein a ratio of oxygen to hafnium in the transitional metal oxide layer is less than 2:1.

4. The resistive element of claim 1, wherein the oxygen vacancies of the transitional metal oxide layer include oxygen vacancies formed by applying an ultraviolet light cure and/or an electron beam cure to the transitional metal oxide layer.

5. The resistive element of claim 1, wherein the transition layer comprises titanium oxide.

6. The resistive element of claim 1, wherein the transition layer is formed using Atomic Layer Deposition.

7. The resistive element of claim 1, wherein the transition layer is thinner than the transitional metal oxide layer.

8. A system comprising the resistive element of claim 1 and further comprising a memory access device formed on the substrate, wherein the memory access device provides read access and write access to a state of the resistive element.

9. The system of claim 8, further comprising a second resistive element, wherein a polarity of the second resistive element is opposite a polarity of the resistive element.

10. A method for forming a resistive element of a resistive memory cell, the method comprising:
    forming a contact on a substrate;
    forming a bottom electrode on the contact;

forming a transitional metal oxide layer on the bottom electrode, wherein the transitional metal oxide layer includes oxygen vacancies configured to receive donor oxygen atoms;

forming a transition layer on the transitional metal oxide layer, wherein the transition layer includes donor oxygen atoms;

forming a reactive metal layer on the transition layer; and forming a top electrode on the transitional metal oxide layer, wherein the transition layer is configured to provide the donor oxygen atoms to the transitional metal oxide layer in response to a voltage being applied to the top electrode.

11. The method of claim 10, wherein the transitional metal oxide layer comprises hafnium and/or hafnium oxide.

12. The method of claim 10, wherein a ratio of oxygen to hafnium in the transitional metal oxide layer is less than 2:1.

13. The method of claim 10, further comprising forming the oxygen vacancies of the transitional metal oxide layer by applying an ultraviolet light cure and/or an electron beam cure to the transitional metal oxide layer.

14. The method of claim 10, wherein the transition layer comprises titanium oxide.

15. The method of claim 10, wherein forming the transition layer includes forming the transition layer using Atomic Layer Deposition.

16. The method of claim 10, wherein the transition layer is thinner than the transitional metal oxide layer.

17. The method of claim 10, further comprising forming a memory access device on the substrate, wherein the memory access device provides read access and write access to a state of the resistive element.

18. The method of claim 17, further comprising forming a second resistive element on the substrate, wherein a polarity of the second resistive element is opposite a polarity of the resistive element.

* * * * *